(12) United States Patent
Saeki et al.

(10) Patent No.: US 11,973,155 B2
(45) Date of Patent: *Apr. 30, 2024

(54) SEALING MATERIAL SHEET FOR SOLAR-CELL MODULE, SOLAR-CELL MODULE USING THE SAME, AND METHOD FOR MANUFACTURING SOLAR-CELL MODULE

(71) Applicant: DAI NIPPON PRINTING CO., LTD., Tokyo (JP)

(72) Inventors: Kosuke Saeki, Tokyo (JP); Shinya Yoneda, Tokyo (JP); Jun Tanaka, Tokyo (JP); Hiroaki Tamaki, Tokyo (JP); Shinsuke Nagino, Tokyo (JP); Naohiro Obonai, Tokyo (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/866,692

(22) Filed: Jul. 18, 2022

(65) Prior Publication Data

US 2022/0352404 A1 Nov. 3, 2022

Related U.S. Application Data

(63) Continuation of application No. 16/381,199, filed on Apr. 11, 2019, now Pat. No. 11,393,941.

(51) Int. Cl.
*H01L 31/048* (2014.01)
*B32B 7/022* (2019.01)
(Continued)

(52) U.S. Cl.
CPC .......... *H01L 31/0481* (2013.01); *B32B 7/022* (2019.01); *B32B 27/08* (2013.01);
(Continued)

(58) Field of Classification Search
None
See application file for complete search history.

(56) References Cited

U.S. PATENT DOCUMENTS

| | | | |
|---|---|---|---|
| 11,393,941 B2 * | 7/2022 | Saeki | H01L 31/0481 |
| 2012/0055539 A1 * | 3/2012 | Kim | H01L 31/0481 |
| | | | 136/251 |

(Continued)

FOREIGN PATENT DOCUMENTS

| | | |
|---|---|---|
| JP | 2009-010277 A | 1/2009 |
| JP | 2018-060837 A | 4/2018 |
| WO | 2012/073971 A1 | 6/2012 |

*Primary Examiner* — Christopher T Schatz
(74) *Attorney, Agent, or Firm* — Oliff PLC

(57) ABSTRACT

To provide a sealing material sheet for a solar-cell module that has high productivity, and can also suppress unevenness in thickness at the time of integration as a solar-cell module. There is provided a sealing material sheet 1 in which there are two inflection point temperatures that are temperatures only around which a change rate of the linear expansion coefficient locally increases, a first inflection point temperature at a low temperature side of two inflection point temperatures is within a range of 55° C. to 70° C., and a second inflection point at a high temperature side of the inflection point temperatures is within a range of 80° C. to 95° C.

12 Claims, 5 Drawing Sheets

(51) Int. Cl.
*B32B 27/08* (2006.01)
*B32B 27/32* (2006.01)
*B32B 37/02* (2006.01)
*B32B 37/10* (2006.01)
*H01L 31/18* (2006.01)

(52) U.S. Cl.
CPC .............. *B32B 27/32* (2013.01); *B32B 37/02* (2013.01); *B32B 37/1018* (2013.01); *H01L 31/186* (2013.01); *B32B 2250/03* (2013.01); *B32B 2250/40* (2013.01); *B32B 2307/30* (2013.01); *B32B 2307/72* (2013.01); *B32B 2457/12* (2013.01)

(56) References Cited

U.S. PATENT DOCUMENTS

| | | |
|---|---|---|
| 2013/0247987 A1 | 9/2013 | Taniguchi et al. |
| 2019/0296166 A1 | 9/2019 | Huang et al. |

* cited by examiner

SEALING MATERIAL SHEET FOR SOLAR-CELL MODULE, SOLAR-CELL MODULE USING THE SAME, AND METHOD FOR MANUFACTURING SOLAR-CELL MODULE

CROSS-REFERENCE TO RELATED APPLICATION

This application is a Continuation of application Ser. No. 16/381,199 filed Apr. 11, 2019. The disclosure of the prior application is hereby incorporated by reference herein in its entirety.

BACKGROUND OF THE INVENTION

Field of the Invention

The present invention relates to a sealing material sheet for a solar-cell module, a solar-cell module using the same, and a method for manufacturing a solar-cell module.

Related Art

Conventionally, as a sealing material sheet used in a solar-cell module, also including a double-sided glass protecting substrate type solar-cell module, from the viewpoints of processability, workability, manufacturing cost, and the like, an ethylene-vinyl acetate copolymer resin (EVA) has been mainly used. However, the EVA resin tends to slowly decompose as it is used for a long period of time, and thus, there is a possibility of generating acetic acid gas affecting a solar cell element. For these reasons, in recent years, a demand for a sealing material sheet for solar-cell module using a polyethylene-based resin instead of the EVA resin has been increasing (see Patent Document 1).

In general, transparency and flexibility of the sealing material sheet for a solar-cell module using a polyethylene-based resin as a base resin can be improved by decreasing the density thereof. However, on the other hand, a decrease in density causes problems such as insufficient heat resistance. In this regard, in the sealing material sheet of Patent Document 2, the heat resistance is imparted by a crosslinking agent. In this case, the heat resistance is reliably improved. However, when a crosslinking treatment is performed to an extent that is sufficient and necessary for providing sufficient heat resistance to be endurable for a long-time use under a high temperature, a problem arises in that followability (hereinafter, referred to as "molding characteristics") to irregularities on a surface of a facing member cannot be maintained, at the time of modularization. Further, in manufacturing processing necessarily including a crosslinking treatment, film formation ability decreases as the crosslinking progresses during molding. Therefore, it is required to carry out molding at a low temperature and to carry out crosslinking reaction again after molding, and it is required to further improve productivity.

As an attempt for solving such problems, a method of dealing with such problems has been investigated in which a sealing material sheet is configured as a multi-layer constitution, and selection of material resins of a core layer and a skin layer, additives, a melting point of each layer, and the like are individually optimized, so that both the heat resistance and the molding characteristics are realized (see Patent Document 2).

However, in manufacturing of a sealing material sheet of a solar-cell module, in a case where the sealing material sheet is configured as a multi-layer sheet, when a difference in melting point of the base resin between the core layer and the skin layer increases to a certain degree or more, a news problem arises in that unevenness in thickness easily occurs in the vicinity of a center and the vicinity of a peripheral portion of the sealing material sheet at the time of a heating treatment in integration as a solar-cell module.

Patent Document 1: Japanese Unexamined Patent Application, Publication No. 2009-10277
Patent Document 2: PCI International Publication No. WO2012/073971

SUMMARY OF THE INVENTION

The present invention was made in view of the above circumstances. An object of the present invention is to provide a sealing material sheet for a solar-cell module that is a sealing material sheet using a polyethylene-based resin, has high productivity without performing crosslinking processing, in addition to heat resistance and molding characteristics, and can also suppress unevenness in thickness at the time of integration as a solar-cell module.

The inventors of the present invention conducted a thorough investigation, and as a result, the inventors found that the above-described problems can be solved by a sealing material sheet being configured as a multi-layer sheet having a constitution of a skin layer—a core layer—a skin layer, and optimizing the composition of the sealing material sheet such that an inflection point temperature at which a change rate of a linear expansion coefficient with respect to a resin temperature locally increases exists at two places in a specific temperature range, respectively. Thus, the inventors finally completed the present invention. More specifically, the present invention provides the following.

(1) A sealing material sheet for a solar-cell module, the sealing material sheet being a multi-layer sheet including a core layer that uses a polyethylene-based resin as a base resin and has a density of 0.925 g/cm$^3$ and a skin layer that is formed on an outermost surface of the sealing material sheet, uses a polyethylene-based resin as a base resin, has a density of 0.875 g/cm$^3$ to 0.905 g/cm$^3$, and contains a silane-modified polyethylene-based resin, in which, in a case where a linear expansion coefficient measured according to JIS K 7197 is represented as a function of a resin temperature, there are two inflection point temperatures that are temperatures only around which a change rate of the linear expansion coefficient locally increases, a first inflection point temperature at a low temperature side of two inflection point temperatures is within a range of 55° C. to 70° C., and a second inflection point at a high temperature side of the inflection point temperatures is within a range of 80° C. to 95° C.

(2) A sealing material sheet for a solar-cell module, the sealing mater al sheet being a multi-layer sheet including a core layer that uses a polyethylene-based resin as a base resin and has a density of 0.905 g/cm$^3$ to 0.925 g/cm$^3$, and a skin layer that uses a polyethylene-based resin as a base resin, has a density of 0.875 g/cm$^3$ to 0.905 g/cm$^3$, and contains a silane-modified polyethylene-based resin, in which both a low melting point resin component having a melting point of 60° C. or higher and lower than 70° C. and a high melting point resin component having a melting point of 95° C. to 110° C. are contained in 25% by mass to 70% by mass in the whole resin component of the sealing material sheet, and an intermediate melting point resin component having a melting point that is higher than the melting point of the low melting point resin component by 20° C. or more and is lower than the melting point of the high melting point resin component by 10° C. or more is contained in 5% by mass to 15% by mass in the whole resin component of the sealing material sheet.

(3) A method for manufacturing a solar-cell module by a vacuum heating lamination method in which module constituent members including the sealing material sheet described in the above (1) or (2) are laminated by a vacuum aspiration and then are subjected to thermocompression, in which, after the vacuum aspiration, a resin temperature of the sealing material sheet at the time of starting the thermocompression is equal to or higher than the first inflection point temperature, and the thermocompression is performed at the second inflection point temperature or higher.

According to the present invention, it is possible to provide a sealing material sheet for a solar-cell module that is a sealing material sheet using a polyethylene-based resin, has high productivity without performing crosslinking processing, in addition to heat resistance and molding characteristics, and can also suppress unevenness in thickness at the time of integration as a solar-cell module.

DETAILED DESCRIPTION OF THE INVENTION

Hereinafter, a sealing material sheet for a solar-cell module of the present invention, a sealing material composition that can be used in manufacturing of the sealing material sheet for a solar-cell module of the present invention, and a solar-cell module using the sealing material sheet of the present invention will be sequentially described.

<Sealing Material Sheet>

The sealing material sheet of the present invention is a sealing material sheet for a solar-cell module that can be manufactured without undergoing a crosslinking treatment and uses a thermoplastic polyethylene-based resin as a base resin. Further, the sealing material sheet of the present invention is a multi-layer sheet that is formed by including a core layer, which is a layer having a relatively high density and a high melting point, and a skin layer, which is a layer formed on an outermost surface of the sealing material sheet and having a relatively low density and a low melting point.

Herein, the melting point in the present specification refers to an average of each intrinsic melting point of each component contained in a measurement target product and melting points obtained by calculation from the blending ratio of these components.

For example, the melting point of the sealing material sheet or each resin layer constituting the sealing material sheet according to the above-described definition can be measured by differential scanning calorimetry (DSC). Incidentally, in a case where there are a plurality of peaks of a valley the DSC curve, the melting point shown by a peak having the largest peak area among the peaks can be regarded as the melting point of the sealing material sheet or each resin layer described above.

Further, as another method of specifying the melting point from the sealing material sheet according to the above-described definition, there is mentioned a method of measuring a linear expansion peak temperature that is a temperature in the largest value at which a linear expansion coefficient shifts from increase to decrease in a case where a measurement linear expansion coefficient measured according to JIS K 7179 is represented as a function of a resin temperature. According to this method, the melting point according to the above-described definition can be approximately specified from a completed product such as a sealing material sheet in a variation range within roughly about 2° C.

Figure 5:
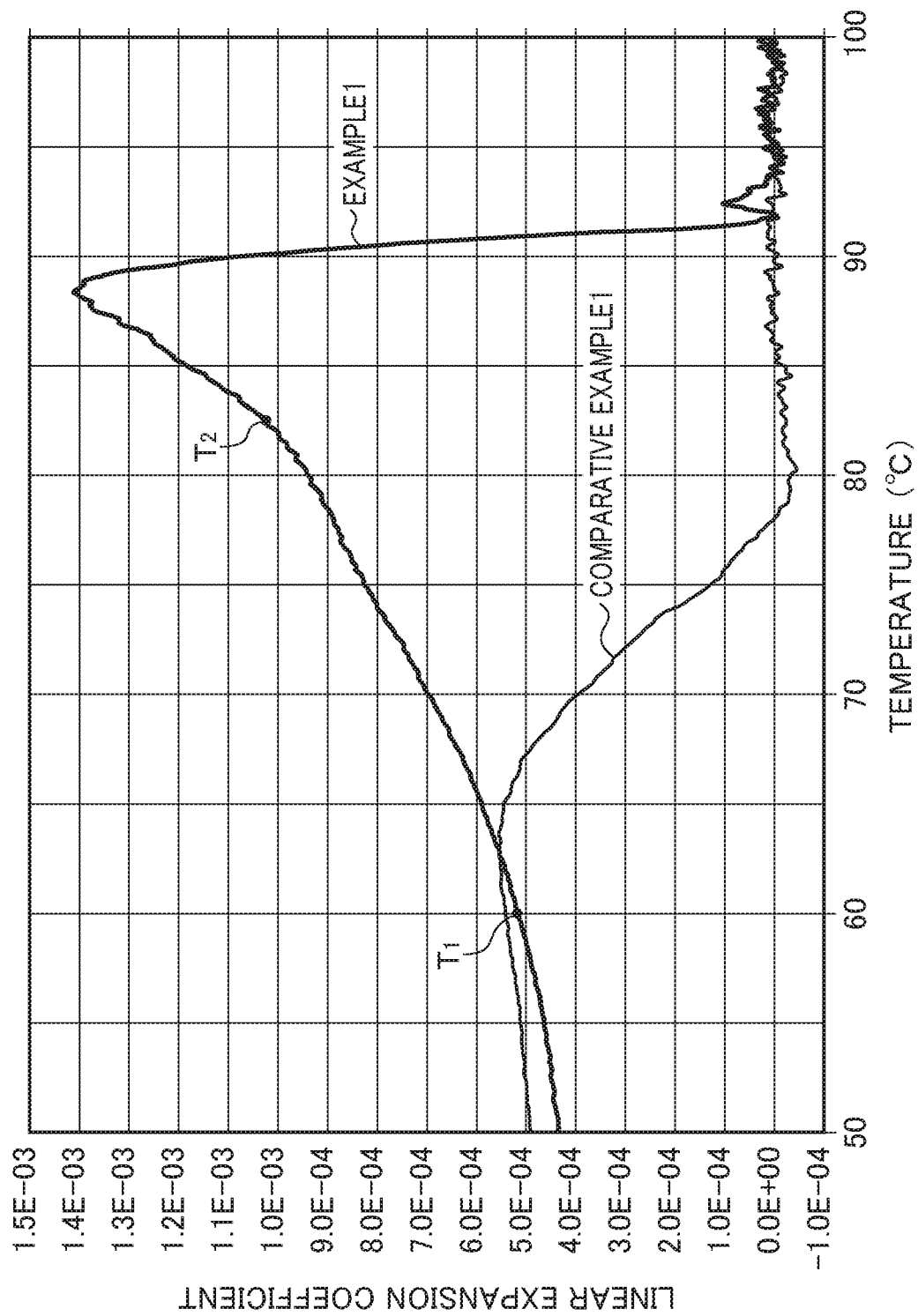
FIG. 5 is a graph showing a relation between a resin temperature and a linear expansion coefficient of the sealing material sheet of the present invention.

This sealing material sheet is, as shown in the graph of FIG. 5, characterized in that, in a case where a linear expansion coefficient measured according to JIS K 7179 is represented as a function of a resin temperature, there are two inflection point temperatures that are temperatures only around which a change rate of the linear expansion coefficient locally increases, a first inflection point temperature at a low temperature side of two inflection point temperatures is within a range of 55° C. to 70° C., and a second inflection point at a high temperature side of the inflection point temperatures is within a range of 80° C. to 95° C.

The "inflection point temperature" in the present specification refers to a point at which a change rate of the linear expansion coefficient clearly changes around the resin temperatures such as points T1 and T2 of the graph of Example 1 in FIG. 5. More specifically, a change rate of the linear expansion coefficient in a range of the resin temperature to about (the resin temperature +3° C.) increases more than a change rate of the linear expansion coefficient in a range of about (the resin temperature −3° C.) to the resin temperature, and the inflection point temperature refers to a temperature at which the increase rate is at least 1.2 times or more preferably 1.35 times or more.

In order for the sealing material sheet to have two inflection point temperatures within a specific temperature range, this can be realized by a low melting point resin component and a high melting point resin component each having a specific melting point range unique to the present invention, and an intermediate melting point resin component having an intermediate melting point between them being contained at a predetermined ratio in the whole resin component of the sealing material sheet.

The above-described low melting point resin component refers to a resin component having a melting point of 60° C. or higher and lower than 70° C. Further, the above-described high melting point resin component refers to a resin component having a melting point of 95'C to 110° C. The sealing material sheet of the present invention may contain both the low melting point resin component and the high melting point resin component in 25% by mass to 60% by mass in the whole resin component of the sealing material sheet.

The above-described intermediate melting point resin component refers to a resin component having a melting point that is higher than the melting point of the above-described low melting point resin component by 20° C. or more and is lower than the melting point of the above-described high melting point resin component by 10° C. or more. The sealing material sheet of the present invention may contain the intermediate melting point resin component in 8% by mass to 15% by mass in the whole resin component of the sealing material sheet.

Details of the sealing material composition that can be formed by the content ratios of the respective resin components each having a different melting point being set in the above-described range will be described later. Incidentally, in the present specification, the melting point of the resin forming each layer of the sealing material sheet refers to a melting point of a resin that can be measured by differential scanning calorimetry (DSC).

Figure 1:
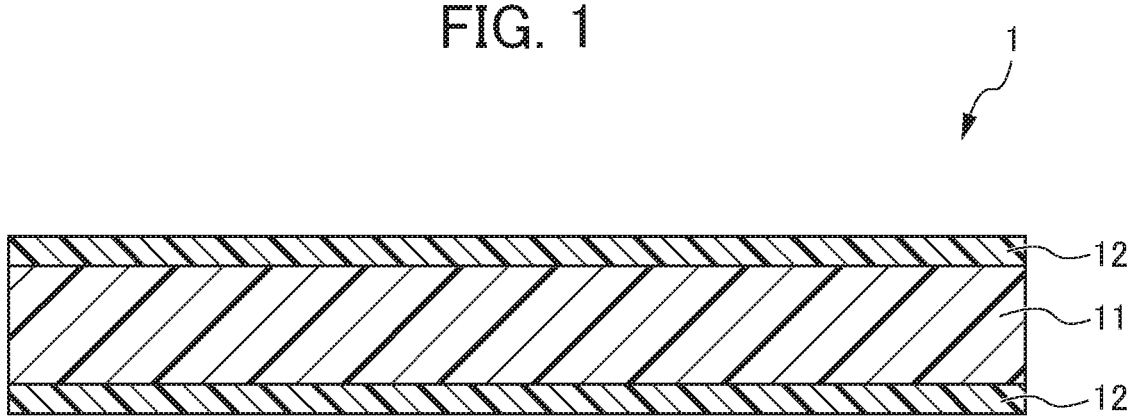
FIG. 1 is a cross-sectional view schematically illustrating a layer constitution of a sealing material sheet of the present invention.

As illustrated in FIG. 1, the sealing material sheet 1 includes a core layer 11 and a skin layer 12 is formed on both surfaces of the core layer 11. However, even in the case of a sealing material sheet in which a core layer has a multi-layer constitution and other functional layers are disposed in the core layer, as long as the sealing material sheet has the core layer and the skin layer that have the constitution requisites of the present invention, and other constitution requisites of the present invention, the sealing material sheet is within the technical scope of the present invention. Incidentally, in the present specification, the skin layer refers to a layer that is disposed at both outermost surface sides of the multi-layer sealing material sheet. Further, in the present specification, the core layer refers to an inner layer other than the above-described skin layer in the multi-layer sealing material sheet. The core layer itself may further have a multi-layer inner constitution, but the sealing material sheet 1 of the three-layer constitution in which the skin layer is laminated on both surfaces of the core layer of the single layer constitution is a typical embodiment of the present invention. Hereinafter, an embodiment of the present invention will be described with a focus on this sealing material sheet 1.

The density of the sealing material sheet 1 of the three-layer constitution including the core layer 11 and the skin layer 12 is preferably 0.895 g/cm³ to 0.915 g/cm³ in terms of average of the whole layer. The density of the core layer 11 may be 0.905 g/cm³ to 0.925 g/cm³ and is preferably 0.910 g/cm³ to 0.920 g/cm³. The density of the skin layer 12 may be 0.875 g/cm³ to 0.905 g/cm³ and is preferably 0.880 g/cm³ to 0.890 g/cm³.

The MFR of the sealing material sheet 1 having the three-layer constitution including the core layer 11 and the skin layer 12 is 3.0 g/10 min or more and less than 5.0 g/10 min and preferably 3.3 g/10 min or more and less than 3.8 g/10 min in terms of average of the whole layer. When the MFR of the sealing material sheet 1 is less than 5.0 g/10 min, heat resistance necessary for the sealing material sheet 1 can be provided. Further, when the MFR thereof is 3.0 g/10 min or more, molding characteristics necessary for the sealing material sheet 1 can be provided.

Incidentally, the MFR in the present specification is a value obtained by the following method unless otherwise particularly specified. MFR (g/10 min): measured according to JIS K 7210. Specifically, a synthetic resin was heated and pressurized at 190° C. in a cylindrical vessel heated by a heater, and the amount of the resin extruded per 10 minutes from an opening (nozzle) provided at the bottom of the vessel was measured. An extrusion Plastometer was used as a testing machine and the extrusion load was 2.16 kg. Incidentally, regarding the MFR of the multi-layer sealing material sheet, a measurement value obtained by performing the measurement by the above-described treatment while the whole layers are in a multi-layer state of being integrally laminated is used as the MFR value of the multi-layer sealing material sheet.

The total thickness of the sealing material sheet 1 having the three-layer constitution including the core layer 11 and the skin layer 12 is preferably 250 μm to 600 μm and more preferably 300 μm to 550 μm. When the total thickness is less than 250 μm, impact cannot be sufficiently alleviated, but when the total thickness is 250 μm or more, for example, even in a case where the total thickness of the sealing material sheet 1 is decreased to about 250 μm, the sealing material sheet 1 can be formed to have both the molding characteristics and the heat resistance at a sufficiently preferable level. Incidentally, in a case where the total thickness exceeds 600 μm, the effect of further improving the impact alleviation effect is hardly obtainable, it is also not possible to respond to the demand for decreasing the thickness of the solar-cell module, and this is not economical, which is not preferable.

Further, the thickness of the core layer 11 in the sealing material sheet 1 is 200 μm to 400 μm and preferably 250 μm to 350 μm. Further, the thickness of each layer of the skin layer 12 is 30 μm to 100 μm and preferably 35 μm to 80 μm. Further, the total thickness of the two skin layers 12 laminated on both surfaces of the core layer is 1/20 to 1/3 and preferably 1/15 to 1/4 of the total thickness of the sealing material sheet 1. When the thickness of each layer of the sealing material sheet 1 is set in such a range, the heat resistance and the molding characteristics of the sealing material sheet 1 can be maintained in a favorable range.

The sealing material sheet 1 is formed by various molding methods generally used for molding a general thermoplastic resin, such as injection molding, extrusion molding, blow molding, compression molding, and rotational molding. As an example of the method for forming a sealing material sheet in a case where the sealing material sheet is a multi-layer film, there is a method for forming a sealing material sheet by coextrusion molding using three kinds of melt kneading/extruding machines.

However, in any methods described above, the melt molding temperature in manufacturing of the sealing material sheet 1 is preferably the melting point of the base resin of the sealing material composition for a core layer contained in the sealing material composition+30° C. or higher. Specifically, the melt molding temperature is preferably set to a high temperature from 175° C. to 230° C. and more preferably set to a high temperature in a region from 190° C. to 210° C. Since the sealing material composition used in the sealing material sheet 1 is a thermoplastic composition not containing a crosslinking agent, it is not necessary to consider the control of unfavorable crosslinking progression during melt molding. According to this, in manufacturing of the sealing material sheet using a polyethylene-based resin as a base resin, limitation on temperature in a case where a thermosetting sealing material composition essentially needing a crosslinking treatment that has been general in the related art is used does not need to be considered, and the melt molding temperature can be set to a higher temperature region in order to improve productivity. According to this, the sealing material sheet 1 can be manufactured with higher productivity that that of the thermosetting sealing material sheet in the related art.

<Sealing Material Composition>

The sealing material sheet 1 can be manufactured by melt molding a sealing material composition that will be hereinafter described in detail. The sealing material composition is separated for each layer into a sealing material composition for a core layer and a sealing material composition for a skin layer. Further, when a multi-layer sheet having a three-layer constitution that includes a core layer as an inner layer and a skin layer as an outermost surface layer is formed by those respective sealing material compositions for a core layer and a skin layer, the sealing material sheet 1 can be manufactured.

[Sealing Material Composition for Core Layer]

The sealing material composition for a core layer is a thermoplastic sealing material composition that uses a polyethylene-based resin as a base resin, does not contain a crosslinking agent, and does not need crosslinking processing at the time of molding a sealing material sheet. Further, the sealing material composition for a core layer may contain an appropriate amount of other resins such as a silane-modified polyethylene-based resin and other components, other than a low-density polyethylene-based resin (LDPE) or the like as a base resin, in a range that does not impair the effect of the present invention.

As the base resin of the sealing material composition for a core layer, a low-density polyethylene-based resin (LDPE), a linear low-density polyethylene-based resin (LL-DPE), or a metallocene-based linear low-density polyethylene-based resin (M-LLDPE) can be preferably used. Of them, from the viewpoint of long-term reliability of the solar-cell module, a low-density polyethylene-based resin (LDPE) can be particularly preferably used as the sealing material composition for a core layer. Incidentally, the "base resin" in the present specification refers to a resin having the largest content ratio in the resin component of the resin composition, in the resin composition containing the base resin.

It is preferable that the sealing material composition for a core layer further contains a predetermined amount of a silane-modified polyethylene-based resin in addition to the above-described base resin. In the sealing material composition for a core layer, the silane-modified polyethylene-based resin is not necessarily an essential component, but in a case where a silane-modified polyethylene-based resin is contained in the sealing material composition for a core layer, it is preferable that the silane-modified polyethylene-based resin is a silane-modified polyethylene-based resin having a weight average molecular weight in terms of polystyrene of 70000 or more and a melting point of about 90° C. and this resin serves as an intermediate melting point resin component in the sealing material sheet.

The density of the sealing material composition for a core layer is 0.905 g/cm$^3$ to 0.925 g/cm$^3$ and preferably 0.910 g/cm$^3$ to 0.920 g/cm$^3$. When the density of the sealing material composition for a core layer is set in the above-described range, the heat resistance and the molding characteristics can be provided to the sealing material sheet 1 at a good balance without undergoing the crosslinking treatment.

The sealing material composition for a core layer contains the high melting point resin component and the low melting point resin component mentioned above as essential components, and it is preferable that the sealing material composition for a core layer further contains the intermediate melting point resin component. The ratio of those resin components is not limited to a specific ratio, but the ratio may be appropriately adjusted such that the above-described three kinds of resin components each having a different melting point are contained at the above-described specific ratio in the whole layer of the sealing material sheet 1 also including the skin layer. Regarding the specific ratio, as described above, in the whole resin component of the sealing material sheet, the specific ratios of both the low melting point resin component and the high melting point resin component are 25% by mass to 70% by mass, and the specific ratio of the intermediate melting point resin component is 5% by mass to 15% by mass.

On the assumption that the content ratio of each resin component in the whole layer of the sealing material sheet is adjusted to be the above-described ratio, the melting point of the sealing material composition for a core layer is preferably 70° C. to 110° C. and more preferably 80° C. cc 100° C. As long as the melting point of the core layer 11 of the sealing material sheet 1 can be maintained in the above-described range, polyethylene-based resins each having a different melting point can be appropriately mixed to obtain a sealing material composition for a core layer. For example, according to a resin composition obtained by mixing three kinds of polyethylene-based resins respectively having melting points of 60° C., 90° C., and 105° C. in each amount of 15 parts by mass, 8 parts by mass, and 82 parts by mass, the melting point of the whole core layer can be set to 97° C., and a blending example of such material resins can be exemplified as a preferable resin blending example of the sealing material composition for a core layer.

When the melting point of the sealing material composition for a core layer is maintained to 70° C. or higher as described above, heat resistance necessary for the sealing material sheet 1 can be imparted. Further, in a relation with heating conditions at the time of melt molding for forming a sheet as the sealing material sheet and at the time of a thermal lamination treatment for integration as the solar-cell module, the melting point of the sealing material composition for a core layer may be generally about 110° C. or lower. Further, in order to sufficiently enhance the molding characteristics of the sealing material sheet 1, the melting point of the sealing material composition for a core layer is more preferably 100° C. or lower.

The melt mass flow rate (MFR) of the sealing material composition for a core layer may be 3.0 g/10 min or more and less than 5.0 g/10 min, and as long as the MFR is in this range, a polyethylene-based resin having an MFR of 0.8 g/10 min or more and less than 5.0 g/10 min can be appropriately mixed and used. When the MFR of the sealing material composition for a core layer is set in the above-described range, the heat resistance and the molding characteristics can be provided to the sealing material sheet 1 at a good balance.

[Sealing Material Composition for Skin Layer]

The sealing material composition for a skin layer is also a thermoplastic sealing material composition that uses a polyethylene-based resin as a base resin and does not contain a crosslinking agent, similarly to the sealing material composition for a core layer. Further, the point that an appropriate amount of other components may be contained in a range that does not impair the effect of the present invention is the same as in the sealing material composition for a core layer.

As the base resin of the sealing material composition for a skin layer, similarly to the sealing material composition for a core layer, a low-density polyethylene-based resin (LDPE), a linear low-density polyethylene-based resin (LL-DPE), or a metallocene-based linear low-density polyethylene-based resin (M-LLDPE) can be preferably used. Of them, from the viewpoint of molding characteristics, a metallocene-based linear low-density polyethylene-based resin (M-LLDPE) can be particularly preferably used as a composition for the skin layer.

It is preferable that the sealing material composition for a skin layer used in the sealing material sheet 1 further contains a silane-modified polyethylene-based resin in addition to the above-described base resin. In the sealing material composition for a skin layer, the silane-modified polyethylene-based resin is not necessarily an essential component, but in a case where the silane-modified polyethylene-based resin is added to the sealing material composition for a skin layer, it is preferable that a silane-modified polyethylene-based resin having a weight average molecular weight in terms of polystyrene of 70000 or more and a melting point of about 90° C. as used, and this silane-modified polyethylene-based resin serves as an intermediate melting point resin component in the sealing material sheet.

The density of the sealing material composition for a skin layer is 0.880 g/cm³ to 0.910 g/cm³ and more preferably 0.899 g/cm³ or less. When the density of the sealing material composition for a skin layer is set in the above-described range, the adhesion of the sealing material sheet 1 can be maintained in a preferable range.

The melting point of the sealing material composition for a skin layer may be 70° C. to 90° C. and is preferably 70° C. to 80° C. As long as the melting point of the skin layer can be maintained in the above-described range similarly to the core layer, polyethylene-based resins each having a different melting point can be appropriately mixed to obtain a sealing material composition for a skin layer. For example, according to a resin composition obtained by mixing three kinds of polyethylene-based resins respectively having melting points of 60° C., 90° C., and 97° C. in each amount of 65 parts by mass, 20 parts by mass, and 20 parts by mass, the melting point of the whole skin layer can be set to 73° C., and a blending example of such material resins can be exemplified as a preferable resin blending example of the sealing material composition for a skin layer. When the melting point of the sealing material composition for a skin layer is set to 70° C. or higher, heat resistance necessary for the sealing material sheet 1 can be imparted. Further, when the melting point of the sealing material composition for a skin layer is set to 90° C. or lower, the molding characteristics of the sealing material sheet at the time of being integrated as the solar-cell module can be maintained in a preferable range.

The melt mass flow rate (MFR) of the sealing material composition for a skin layer may be 3.0 g/10 min or more and less than 5.0 g/10 min, and as long as the MFR is in this range, a polyethylene-based resin having an MFR of 0.8 g/10 min or more and less than 5.0 g/10 main can be appropriately mixed and used. When the MFR of the sealing material composition for a skin layer is set in the above-described range, the heat resistance and the molding characteristics can be provided to the sealing material sheet 1 at a good balance.

[Silane-Modified Polyethylene-Based Resin]

Regarding the sealing material sheet 1, it is preferable that a silane-modified polyethylene-based resin is contained in each layer, and further, it is preferable that the silane-modified polyethylene-based resin contained in each layer is a "high molecular weight type silane-modified polyethylene-based resin."

The silane-modified polyethylene-based resin is obtained by graft polymerization of an ethylenically unsaturated silane compound as a side chain using a linear low-density polyethylene-based resin (LLDPE) or the like as a main chain. Further, the "silane-modified polyethylene-based resin" in the present specification is a copolymer obtained by copolymerization using at least an α-olefin and an ethylenically unsaturated silane compound as comonomers and optionally other unsaturated monomer as a comonomer and includes a product of modification or condensation of such a copolymer.

Alternatively, a copolymer of an α-olefin and an ethylenically unsaturated silane compound or a product of modification or condensation of the copolymer can be produced, for example, by the following method. First, one or two or more α-olefins and optionally one or two or more unsaturated monomers are subjected to simultaneous or stepwise polymerization using a desirable reaction vessel in the presence of a radical polymerization initiator and optionally a chain transfer agent as described above. Then, the polyolefin-based polymer produced by the polymerization is subjected to graft copolymerization of one or two or more ethylenically unsaturated silane compounds. Then, further, silane compound moieties that constitute the graft copolymer produced by the copolymer are optionally modified or condensed. Through the above process, a copolymer of the α-olefin and the ethylenically unsaturated silane compound or a product of modification or condensation of the copolymer can be produced.

As the silane-modified polyethylene-based resin, any of a random copolymer, an alternating copolymer, a block copolymer, and a graft copolymer can be preferably used. However, the silane-modified polyethylene-based resin is more preferably a graft copolymer and even more preferably a graft copolymer having a polyethylene main chain for polymerization and an ethylenically unsaturated silane compound-derived side chain grafted to the main chain. Such a graft copolymer in which silanol groups contributable to adhesion force have a high degree of freedom can improve the adhesion of other member in the solar-cell module, particularly, the sealing material sheet to a glass substrate or the like.

The content of the ethylenically unsaturated silane compound when the silane-modified polyethylene-based resin is formed is, for example, about 0.001 to 15% by mass, preferably about 0.01 to 5% by mass, and particularly preferably about 0.05 to 2% by mass with respect to the total mass of the copolymer. In a case where the content of the ethylenically unsaturated silane compound that constitutes the copolymer of the α-olefin and the ethylenically unsaturated silane compound is in the above-described range, particularly, adhesion of the sealing material sheet with glass is significantly improved. When the content of the silane compound exceeds the above-described range, tensile elongation, heat sealability, and the like of the sealing material sheet tend to be degraded, which is not preferable.

In the sealing material sheet 1, of the silane-modified polyethylene-based resins described above, the "high molecular weight type silane-modified polyethylene-based resin" in a particular molecular weight range is preferably used as a resin essentially added to the sealing material composition for a skin layer. Regarding the molecular weight of the high molecular weight type silane-modified polyethylene-based resin used as a resin essentially added to the sealing material composition for a skin layer, the weight average molecular weight in terms of polystyrene is 70000 to 120000 and particularly 90000 to 120000. Incidentally, when the molecular weight of the silane-modifed polyethylene-based resin exceeds 120000, compatibility with the base resin, which is assumed that the MFR is preferably about 3.0 g/10 min to 5.0 g/10 min deteriorates, which is not preferable.

The measurement of the molecular weight of each resin component that constitutes the sealing material sheet 1 can be performed using a conventionally known GPC method. Incidentally, since polyolefin is hardly dissolved in a solvent at normal temperature, it is preferable that the molecular weight is measured using a solvent such as trichlorobenzene or o-dichlorobenzene by GPC of a high temperature of 140 to 150° C. Particularly in the case of the sealing material sheet 1, in order to measure the molecular weight of the silane-modified polyethylene-based resin contained in the skin layer 12, the molecular weight of the silane-modified polyeylene-based resin can be specified by separating the skin layer of the sealing material sheet 1 that is a multi-layer sheet, combining the molecular weight measurement and component analysis by GPC-FTIR or the like, and reading the molecular weight corresponding to a component identified by IR, Incidentally, a number average molecular weight Mn, a weight average molecular weight Mw, and a degree of dispersion d in a case where a polymer having a molecular weight Mi (g/mol) is Ni (polymers) in the skin layer of the sealing mateiral sheet 1 are defined by the following equations, respectively. Number average molecular weight $Mn=\Sigma(MiNi)/\Sigma Ni$ Weight average molecular weight $Mw=\Sigma(Mi^2Ni)/\Sigma MiNi$ Degree of dispersion $d=Mw/Mn$

[Other Additive Components]

To the respective sealing material compositions for a core layer and a skin layer that constitute the sealing material sheet 1, particularly, the sealing material composition for a skin layer, an adhesion improver can be appropriately added. As the adhesion improver, a known silane coupling agent can be used, but a silane coupling agent having an epoxy group (hereinafter, also referred to as an "epoxy-based silane coupling agent") or a silane coupling agent having a mercapto group (hereinafter, also referred to as a "mercapto-based silane coupling agent") can be particularly preferably used.

Other components can be further contained in the respective sealing material compositions for a core layer and a skin layer. For example, components such as a weathering master batch for imparting weatherability to the sealing material sheet, various fillers, a light stabilizer, an ultraviolet ray absorbent, and a heat stabilizer can be exemplified. The contents of those components vary depending on the shapes, densities, and the like of particles thereof, but are preferably in a range of about 0.001% by mass to 5% by mass in the respective sealing material compositions. By including such additives, the stable mechanical strength, effect on preventing yellowing or cracks, and the like for a long period of time can be imparted to the sealing material sheet.

<Solar-Cell Module>

The sealing material sheet 1 can be widely used in various solar-cell modules that are conventionally known in general, in the solar-cell module, a sealing material sheet is disposed in a mode of being interposed between both surfaces of the solar cell element and sealing the surfaces. On the other hand, the sealing material sheet. I can also be disposed as a sealing material sheet on both surfaces of the solar cell element or only a sealing material sheet on any one of the surfaces can also be used in the sealing material sheet 1. Further, the sealing material sheet 1 can be particularly preferably used in a solar-cell module in which a convex portion having a relatively high height such as a lead wire is formed on a solar cell element, such as a thin film solar-cell module.

Figure 2:
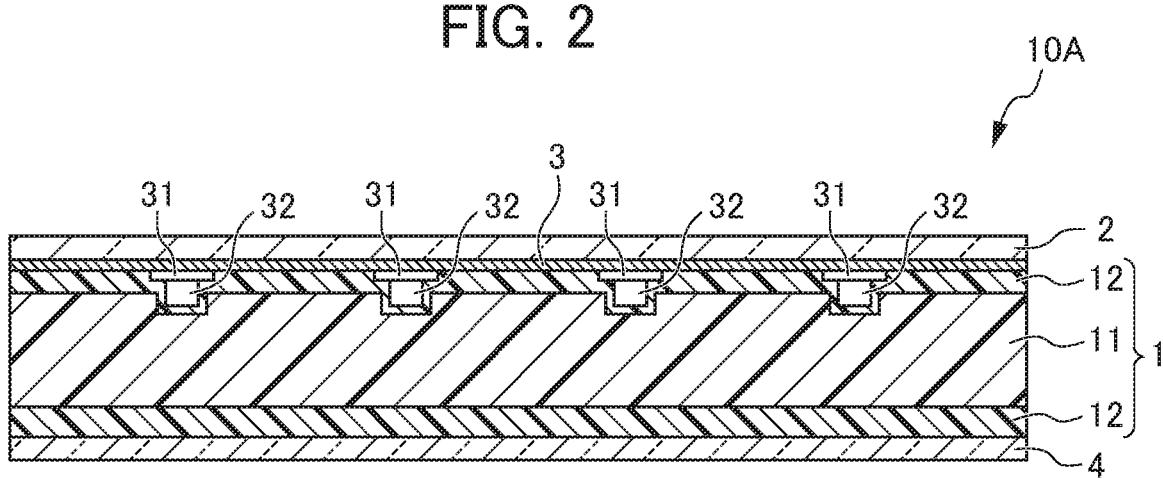
FIG. 2 is a cross-sectional view schematically illustrating an example of a layer constitution of a solar-cell module that is formed using the sealing material sheet of the present invention and a thin film solar cell element.

FIG. 2 is a cross-sectional view illustrating an example ora layer constitution of a thin film solar-cell module 10 that can be formed using the sealing material sheet 1 of the present invention. The solar-cell module 10 includes a transparent front substrate 2, a thin film solar cell element 3 disposed on the surface of the transparent front substrate 2, a sealing material sheet (the sealing material sheet 1), and a rear-surface protecting substrate 4 which are laminated in this order from a light receiving surface side of incident light. In the thin film solar-cell module 10, the sealing material sheet (the sealing material sheet 1) is laminated at a non-light receiving surface side of the solar cell element 3.

Figure 3:
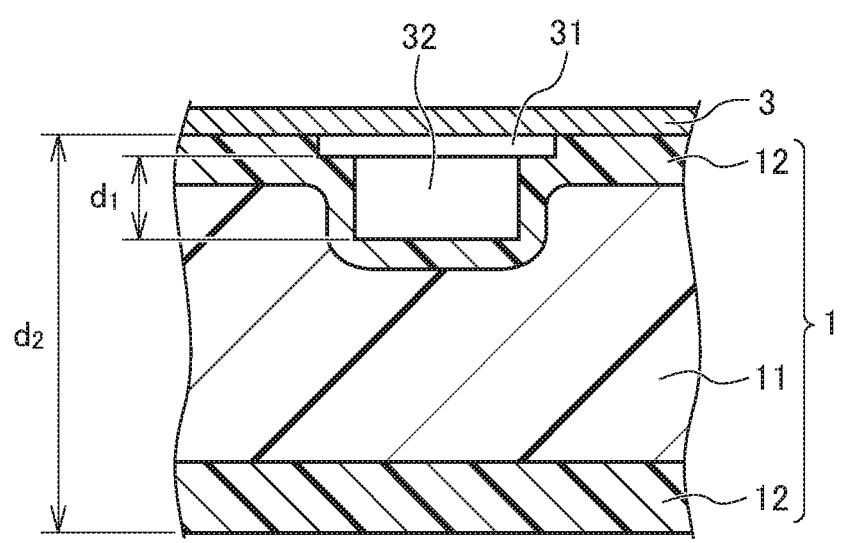
FIG. 3 is a partially enlarged view of FIG. 2 and is a view for description of molding characteristics of the sealing material sheet of the present invention in the case of being used in a thin film solar-cell module.

Herein, in the solar-cell module 10, as illustrated in FIG. 3, there are irregularities due to a metal electrode 31 or a lead wire 32 for power collection on the surface at the non-light receiving surface side of the solar cell element 3. In the case of using a sealing material sheet that uses a polyethylene-based resin as a base resin in the related art, when heat resistance is intended to be secured by performing the crosslinking treatment or simply increasing a density, a problem arises in that voids V due to insufficiency of molding characteristics are formed (see FIG. 4).

However, in a case where the sealing material sheet 1 in which both the heat resistance and the molding characteristics are achieved at a high level is disposed on the irregularity surface, the sealing material sheet 1 also sufficiently wraps around the irregularities due to the metal electrode 31 or the lead wire 32 for power collection which are present on the surface of the non-light receiving surface side of the solar cell element 3 and can prevent the formation of the voids V (see FIG. 3). That is, in a case where there are irregularities formed by convex portions of the lead wire 32 or the like on the surface of the solar cell element like the solar-cell module 10, the sealing material sheet 1 can be particularly preferably used. In a case where the thickness of the convex portions of the irregularities is 50% to 90% of the thickness of the sealing material sheet 1, the molding characteristics of the sealing material sheet are particularly exhibited. According to this, as described above, it is possible to sufficiently prevent the formation of the voids V due to existence of the irregularities on the surface of the solar cell element.

Figure 4:
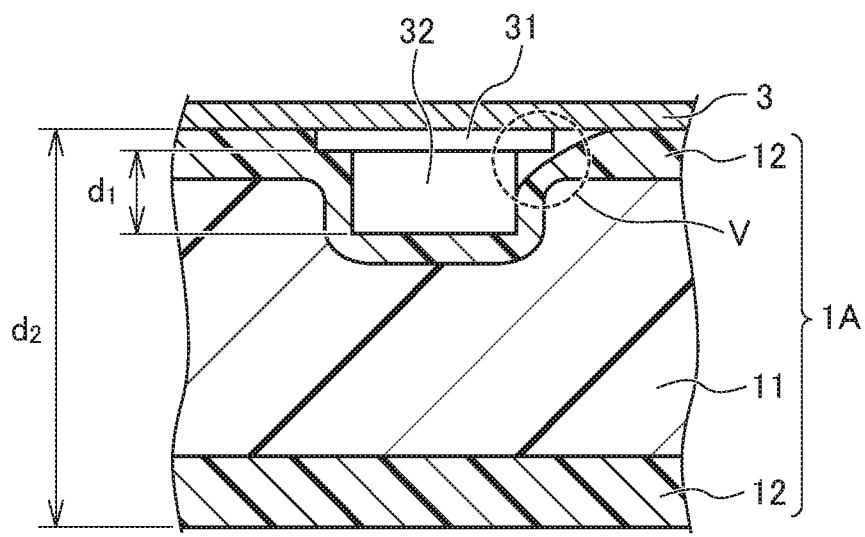
FIG. 4 is a partially enlarged cross-sectional view of a conventional solar-cell module using a conventional sealing material sheet inferior in molding characteristics as a thin film solar-cell module.

More specifically, in a case where the lead wire 32 is a lead wire having a thickness that is equal to or more than about a thickness ($d_1$) of 250 μm, the sealing material sheet 1 exhibits a particular effect that is significantly different from a conventional product. For example, as illustrated in FIG. 5, when the sealing material sheet 1 formed from a conventionally general polyethylene resin is disposed on the irregularity surface in a case where the thick lead wire 32 is disposed, in general, in a case where the thickness ($d_1$) of the lead wire 32 with respect to a thickness ($d_2$) of the sealing material sheet 1 exceeds 50% as a rough standard, the formation of the voids V described above becomes problematic in many cases. However, as illustrated in FIG. 4, in a case where the sealing material sheet 1 is disposed on such a irregularity surface, when the thickness ($d_1$) of the lead wire 32 with respect to the thickness ($d_2$) of the sealing material sheet 1 is 90% or less, is possible to sufficiently prevent the formation of the voids V described above. Incidentally, in the present invention, in a case where a plurality of lead wires are laminated, for example, a case where lead wires are alternately disposed, the total thickness of the plurality of lead wires in a part at which the plurality of lead wires are laminated is considered as "the thickness of the lead wire" as described above, that is, "the thickness of the convex portion"

[Method for Manufacturing Solar-Cell Module]

The solar-cell module 10 can be manufactured by sequentially laminating the members including the sealing material sheet 1, integrating the laminated members by a vacuum aspiration or the like, and then, thermocompression-molding the above members in one molding, body by a molding method such as a laminating method.

Herein, in a general laminating machine used in the above-described manufacturing method, the heating temperature during the vacuum aspiration tends to be largely different between the vicinity of the center portion and the vicinity of the end portion of the sealing material sheet, and heating tends to be excessive in the center portion and to be insufficient in the end portion. In a case where a conventional thermoplastic multi-layer sheet is used as the sealing material sheet, due to this, the degree of melting and softening in the surface of the sealing material sheet at a time point immediately before the thermocompression also largely varies. Further, as a result of this, a variation in thickness of the sealing material sheet after the thermocompression may occur.

The sealing material sheet 1 achieves both the heat resistance and the molding characteristics by mixing the high melting point resin component and the low melting point resin component and an appropriate amount of the intermediate melting point resin component is further added. Thus, a variation in degree of melting and softening of the surface of the above-described sealing material sheet is decreased, and according to this, a variation in thickness of the above-described sealing material sheet can be suppressed.

In the method for manufacturing a solar-cell module of the present invention, after the vacuum aspiration, the heating condition is adjusted such that the resin temperature of the sealing material sheet at the time of starting the thermo compression is equal to or higher than the first inflection point temperature and equal to or lower than the second inflection point temperature. Thus, the above-described effect can be achieved.

EXAMPLES

Hereinafter, the present invention will be described in more detail with reference to Examples, but the present invention is not limited to the following Examples.

<Manufacturing of Sealing Material Sheet for Solar-Cell Module>

Sealing material composition raw materials described below were mixed at a ratio (parts by mass) in the following Table 1 to obtain sealing material compositions for a core layer and a sealing material composition for a skin layer of sealing material sheets of Example and Comparative Examples. Each resin sheet for making respective sealing material compositions for a core layer and a skin layer was produced using a φ 30 mm extruder and a film molding machine having a T die having a width of 200 nm at an extrusion temperature of 210° C. and a pulling speed of 1.1 m/min. Further, these respective resin sheets were laminated to manufacture a sealing material sheet having a three-layer constitution of each of Example and Comparative Examples that includes a core layer and a skin layer disposed on both outermost surfaces. The thicknesses of the respective sealing material sheets of Example and Comparative Examples were all set to a total thickness of 450 μm. Regarding the thickness ratio of each layer of the sealing material sheet having a three-layer constitution of each of Example and Comparative Examples, in all of the sealing material sheets, the thickness ratio of the skin layer:the core layer:the skin layer was set to 1:5.5:1.

As a material resin of the sealing material composition for molding each resin sheet for a sealing material sheet, the following respective raw materials were used. Polyethylene-based resins 1 to 4 (respectively described as "PE1 to PE4" in Table)

all being metallocene-based linear low-density polyethylene-based resin (M-LLDPE). The density, the melting point, and the MFR at 190° C. were respectively as described in Table 1. Silane-modified polyethylene-based resin 1 (described as "PS1" in Table)

a silane-modified polyethylene-based resin obtained by mixing 2 parts bv mass of vinyltrimethoxysilane and 0.15 part by mass of dicumyl peroxide as a radical generating agent (reaction catalyst) with respect to 100 parts by mass of metallocene-based linear low-density polyethylene-based resin having a density of 0.900 g/cm$^3$ and an MFR of 2.0 g/10 min and melting and kneading the mixture at 200° C. Density of 0.900 g/cm$^3$, MFR of 1.0 g/10 min. Melting point of 90° C. Silane-modified polyethylene-based resin 2 (described as "PS2" in Table)

a silane-modified polyethylene-based resin obtained by mixing 2 parts by mass of vinyltrimethoxysilane and 0.15 part by mass of dicumyl peroxide as a radical generating agent (reaction catalyst) with respect to 100 parts by mass of metallocene-based linear low-density polyethylene-based resin having a density of 0.880 g/cm$^3$ and an MFR of 3.5 g/10 min and melting and kneading the mixture at 200° C. Density of 0.880 g/cm$^3$, MER of 2.0 g/10 min Melting point of 60° C.

TABLE 1

|  |  | Polyethylene | | | | Silane-modified polyethylene | |
|---|---|---|---|---|---|---|---|
|  |  | PE1 | PE2 | PE3 | PE4 | PS1 | PS2 |
|  | Density (g/cm$^3$) | 0.880 | 0.898 | 0.905 | 0.919 | 0.900 | 0.880 |
|  | MFR (g/10 min.) | 3.5 | 3.5 | 3.5 | 3.5 | 1.0 | 2.0 |
|  | Melting point (° C.) | 60 | 90 | 97 | 105 | 90 | 60 |
| Example1 | Core layer | 15 | 5 | — | 82 | 3 | — |
|  | Skin layer | 85 | 5 | — | — | 15 | — |
| Comparative Example1 | Core layer | 82 | 5 | 15 | — | 3 | — |
|  | Skin layer | 85 | 5 | — | — | 15 | — |
| Comparative Example2 | Core layer | 20 | — | — | 82 | — | 3 |
|  | Skin layer | 90 | — | — | — | — | 15 |

<Measurement of Linear Expansion Coefficient>.

The linear expansion coefficient of each sealing material sheet of Example and Comparative Examples cut into a size of 5 mm×20 mm was measured according to JIS K 7197. The measurement was performed by the following measurement apparatus and measurement conditions. Measurement apparatus: ThermoMechanical Analyzer MIA/SS-6000) manufactured by Seiko Instruments Inc. Constant-load tensile mode: 20 mN, Measurement temperature range: −50° C. to 110° C. The linear expansion peak temperature and the linear expansion convergence point temperature of the sealing material sheet of each of Example and Comparative Examples obtained by the above-described measurement were as presented in Table 1. Incidentally, FIG. 5 is a graph representing, as a function of a resin temperature, a linear expansion coefficient measured as described above, particularly, of Example 1 and Comparative Example 2. From the graph of FIG. 5, it is found that only Example 1 has two inflection point temperatures, the first inflection point temperature is within a range of 55° C. to 70° C. (60° C.), and the second inflection point is within a range of 80° C. to 95° C. (83° C.)

Evaluation Example 1

Molding Characteristics

A lead wire (diameter: 250 μm) was disposed on the surface of colorless strengthened glass having a flat surface, the lead wire was further covered, and a laminate obtained by laminating each sealing material sheet of Example and Comparative Examples cut into a size of 150 mm×150 mm was subjected to a vacuum heating lamination treatment at a set temperature of 150° C. under a vacuum aspiration for 3 minutes and an atmospheric pressurization of 7 minutes, thereby obtaining a sample for solar-cell module evaluation of each of Example and Comparative Examples. The resin temperature (achieving temperature) of the sealing material sheet in lamination during the heating treatment was 147° C. These samples for solar-cell module evaluation were visually observed, and molding characteristics were evaluated by the following evaluation criteria.
(Evaluation Criteria)
  A: The sealing material sheet completely followed irregularities of the facing base material surface. Formation of voids was not observed.
  B: Five or less of air bubbles within 2 mm² were observed.
  C: A part of the sealing material sheet did not completely follow irregularities of the facing base material surface and lamination defect parts (voids) were partially formed in the vicinity of the lead wire.
The evaluation results are described as "Molding characteristics" in Table 2.

Evaluation Example 2

Heat Resistance Test

A heat-resistant creep test was performed as a heat resistance test. One sheet of the sealing material sheet of each of Example and Comparative Examples cut into a size of 5 cm×7.5 cm was superimposed on the same glass plate as in Evaluation Example 1 described above, the same glass plate as in Evaluation Example 1 having a size of 5 cm×7.5 cm was superimposed from the above, and a vacuum heating lamination treatment was performed under the same conditions as in Evaluation Example 1 to prepare samples for evaluation. Thereafter, large-sized glass was placed vertically and left at 105° C. for 12 hours, the moving distance (mm) of the glass plate having a size of 5 cm×7.5 cm after being left was measured, and the heat resistance was evaluated by the following evaluation criteria
(Evaluation Criteria)
  A: 0.0 mm or more and less than 0.5 mm
  B: 0.5 mm or more and less than 1.0 mm
  C: 1.0 mm or more
The evaluation results are described as "Heat resistance" in Table 2.

Evaluation Example 3

Thickness Uniformity of Sealing Material

One sheet of the sealing material sheet of each of Example and Comparative Examples cut into a size of 40 cm×40 cm was superimposed on the same glass plate as in Evaluation Example 1 described above having a size of 40 cm×40 cm, the same glass plate as in Evaluation Example 1 having a size of 40 cm×40 cm was superimposed from the above, and a vacuum heating lamination treatment was performed under the same conditions as in Evaluation Example 1 to prepare samples for evaluation. Thereafter, comparing film thicknesses in the center portion and the end portion of the substrate, the thickness uniformity of the sealing material sheet was measured, and the thickness uniformity of the sealing material was evaluated by the following evaluation criteria Incidentally, the measurement was performed by "Micrometer" manufactured by Mitutoyo Corporation. Further, after the vacuum aspiration, the resin temperature of the sealing material sheet at the time of starting the thermocompression was 90° C., the first inflection point temperature of the sealing material sheet of Example 1 was (60° C.) or higher, and the thermocompression temperature was a temperature higher than the second inflection point (157° C.).
(Evaluation Criteria)
  A: The difference (range) between the largest film thickness and the smallest film thickness was less than 60 μm.
  B: The difference (range) between the largest film thickness and the smallest film thickness was 60 μm or more.
The evaluation results are described as "Uniformity" in Table 2.

TABLE 2

| | Sealing material sheet resin component ratio (% by mass) | | | | | | | | | | | |
|---|---|---|---|---|---|---|---|---|---|---|---|---|
| | Low melting point | | | Intermediate melting point | | | High melting point | | | Molding characteristics | Heat resistance | Uniformity |
| | Core layer | Skin layer | Whole layer | Core layer | Skin layer | Whole layer | Core layer | Skin layer | Whole layer | | | |
| Example 1 | 14.3 | 81.0 | 27.6 | 7.6 | 19.0 | 9.9 | 78.1 | 0.0 | 62.5 | A | A | A |
| Comparative Example 1 | 78.1 | 81.0 | 78.7 | 7.6 | 19.0 | 9.9 | 14.3 | 0.0 | 11.4 | A | B | A |
| Comparative Example 2 | 17.1 | 95.2 | 32.7 | 4.8 | 4.8 | 4.8 | 78.1 | 0.0 | 62.5 | A | A | B |

From Tables 1 and 2 and FIG. 5, it is found that the sealing material sheet of the present invention is a sealing material sheet using a polyethylene-based resin and is a sealing material sheet for a solar-cell module that has high productivity without performing crosslinking processing, in addition to heat resistance and molding characteristics, and can also suppress unevenness in thickness at the time of integration as a solar-cell module.

What is claimed is:

1. A sealing material sheet for a solar-cell module, the sealing material sheet comprising:
   a core layer containing a polyethylene-based resin; and
   a skin layer formed as a top-most surface of the sealing material sheet, and containing a polyethylene-based resin and a silage-modified polyethylene-based resin, wherein:
   a density of the core layer is greater than a density of the skin layer,
   a graph representing a linear expansion coefficient of the sealing material sheet as a function of a resin temperature as measured according to JIS K 7197 includes two inflection point temperatures at which a change rate of the linear expansion coefficient increases:
      a first inflection point temperature within a range of 55° C. to 70° C., and
      a second inflection point temperature within a range of 80° C. to 95° C.,
   the change rate of the linear expansion coefficient from the first inflection point temperature to a temperature +3° C. the first inflection point temperature is larger than the change rate of the linear expansion coefficient from a temperature −3° C. the first inflection point temperature to the first inflection point temperature,
   the change rate of the linear expansion coefficient from the second inflection point temperature to a temperature +3° C. the second inflection point temperature is larger than the change rate of the linear expansion coefficient from a temperature −3° C. the second inflection point temperature to the second inflection point temperature.

2. The sealing material sheet according to claim 1, wherein:
   the change rate of the linear expansion coefficient from the first inflection point temperature to the temperature +3° C. the first inflection point temperature is at least 1.2 times the change rate of the linear expansion coefficient from the temperature −3° C. the first inflection point temperature to the first inflection point temperature, and
   the change rate of the linear expansion coefficient from the second inflection point temperature to the temperature +3° C. the second inflection point temperature is at least 1.2 times the change rate of the linear expansion coefficient from the temperature −3° C. the second inflection point temperature to the second inflection point temperature.

3. The sealing material sheet according to claim 1, wherein:
   the change rate of the linear expansion coefficient from the first inflection point temperature to the temperature +3° C. the first inflection point temperature is at least 1.35 times the change rate of the linear expansion coefficient from the temperature −3° C. the first inflection point temperature to the first inflection point temperature, and
   the change rate of the linear expansion coefficient from the second inflection point temperature to the temperature +3° C. the second inflection point temperature is at least 1.35 times the change rate of the linear expansion coefficient from the temperature −3° C. the second inflection point temperature to the second inflection point temperature.

4. The sealing material sheet according to claim 1, wherein:
   a thickness of the core layer is at least 200 μm and no more than 400 μm, and
   a thickness of the skin layer is at least 30 μm and no more than 100 μm.

5. A solar-cell module comprising, in order:
   a transparent front substrate;
   a solar cell element;
   the sealing material sheet according to claim 1; and
   a rear-surface protecting substrate.

6. The solar-cell module according to claim 5, further comprising:
   a lead wire disposed between the solar cell element and the sealing material sheet,
   wherein a thickness of the lead wire is no more than 90% relative to a thickness of the sealing material sheet.

7. A method for manufacturing a solar-cell module by a vacuum heating lamination method, the method comprising:
   laminating module constituent members including the sealing material sheet according to claim 1 by vacuum aspiration;
   after the vacuum aspiration, setting a resin temperature of the sealing material sheet to equal to or higher than the first inflection point temperature, and then subjecting the laminated module constituent members to thermocompression at the second inflection point temperature or higher.

8. A sealing material sheet for a solar-cell module, the sealing material sheet comprising:
   a core layer containing a polyethylene-based resin; and
   a skin layer containing a polyethylene-based resin and a silane-modified polyethylene-based resin, wherein a whole resin component of the sealing material sheet contains:
a low melting point resin component having a melting point of at least 60° C. and less than 70° C., in an amount of at least 25% by mass and no more than 70% by mass of the whole resin component,
a high melting point resin component having a melting point of at least 95° C. and no higher than 110'C in an amount of at least 25% by mass and no more than 70% by mass of the whole resin component, and
an intermediate melting point resin component having a melting point that is at least 20° C. higher than the melting point of the low melting point resin component and at least 10° C. lower than the melting point of the high melting point resin component, in an amount of at least 5% by mass and no more than 15% by mass of the whole resin component.

9. The sealing material sheet according to claim 8, wherein:
a thickness of the core layer is at least 200 μm and no more than 400 μm, and
a thickness of the skin layer is at least 30 μm and no more than 100 μm.

10. A solar-cell module comprising, in order:
a transparent front substrate;
a solar cell element;
the sealing material sheet according to claim 8; and
a rear-surface protecting substrate.

11. The solar-cell module according to claim 10, further comprising:
a lead wire disposed between the solar cell element and the sealing material sheet,
wherein a thickness of the lead wire is no more than 90% relative to a thickness of the sealing material sheet.

12. A method for manufacturing a solar-cell module by a vacuum heating lamination method, the method comprising:
laminating module constituent members including the sealing material sheet according to claim 8 by vacuum aspiration;
after the vacuum aspiration, setting a resin temperature of the sealing material sheet to equal to or higher than the first inflection point temperature, and then subjecting the laminated module constituent members to thermocompression at the second inflection point temperature or higher.

\* \* \* \* \*